United States Patent [19]
Murray, Jr. et al.

[11] Patent Number: 4,586,129
[45] Date of Patent: Apr. 29, 1986

[54] APPARATUS AND METHOD FOR TESTING AND VERIFYING THE TIMING LOGIC OF A CATHODE RAY TUBE DISPLAY

[75] Inventors: Thomas L. Murray, Jr., Merrimack, N.H.; Kin C. Yu, Burlington; Thomas O. Holtey, Newton, both of Mass.

[73] Assignee: Honeywell Information Systems Inc., Waltham, Mass.

[21] Appl. No.: 510,712

[22] Filed: Jul. 5, 1983

[51] Int. Cl.⁴ .................. G06F 3/153; H04N 5/04
[52] U.S. Cl. ......................... 364/200; 358/148
[58] Field of Search ... 364/200 MS File, 900 MS File, 364/521; 340/749, 750, 814, 724; 358/10, 139, 148, 152, 17

[56] References Cited
U.S. PATENT DOCUMENTS

| | | | |
|---|---|---|---|
| 4,019,090 | 4/1977 | Wolff et al. | 340/724 X |
| 4,063,288 | 12/1977 | Eckenbrecht | 358/148 |
| 4,309,700 | 1/1982 | Kraemer | 340/749 X |
| 4,349,839 | 9/1982 | McGinn | 358/148 |
| 4,402,011 | 8/1983 | Newton | 358/148 |

Primary Examiner—Harvey E. Springborn
Attorney, Agent, or Firm—George Grayson; John S. Solakian

[57] ABSTRACT

A data processing system includes a cathode ray tube (CRT) display. Apparatus associated with the CRT tests and verifies the vertical and horizontal synchronization and the logic associated with a character generator. Refresh signals, horizontal synchronization signals and data bit signals from the character generator are counted. The counts of those signals which occur within a predetermined number of occurrences of vertical synchronization signals are verified.

7 Claims, 6 Drawing Figures

APPARATUS AND METHOD FOR TESTING AND VERIFYING THE TIMING LOGIC OF A CATHODE RAY TUBE DISPLAY

RELATED APPLICATIONS

The following U.S. patent application filed on an even date with the instant application and assigned to the same assignee as the instant application is related to the instant application and is incorporated herein by reference.

"Apparatus and Method for Testing and Verifying the Refresh Logic of Dynamic MOS Memories" by Thomas L. Murray, Jr. and Thomas O. Holtey, filed on 07/05/83 and having U.S. Ser. No. 510,711.

BACKGROUND OF THE INVENTION

1. Field of the Invention

This invention relates to data processing systems and more particularly to apparatus for testing and verifying the timing and logic of a cathode ray tube display subsystem.

2. Description of the Prior Art

Cathode ray tube (CRT) displays are used in current-day data processing systems as a terminal for accessing or updating a data base stored in a memory. Information from the data base is displayed on the face of the CRT in the form of characters made up of a dot matrix. Typically such dot matrices are 7 dots wide by 9 dots high in an area which is the equivalent of 9 dots wide by 12 dots high.

In a raster scan CRT display, an electron beam starts in the upper lefthand corner of the CRT, moves horizontally across the screen and returns. This action is called a horizontal scan. After each horizontal scan, the beam is incrementally moved down in the vertical direction until it reaches the bottom of the CRT. The beam is then moved vertically to its starting position.

As the beam progresses horizontally across the face of the tube, narrow voltage pulses are applied to the beam which show up as light spots on the face of the tube. Therefore 9 horizontal scans of the beam would display a row of characters. Three horizontal scans separate adjacent rows.

Therefore, 300 horizontal scans will display 25 rows of characters ($12 \times 25 = 300$). However, there may be typically 317 scan lines. Each scan line takes 52.569 microseconds. The total sweep time for the 317 scan lines is 16.66 milliseconds ($52.569 \times 317$) or at a 60 hertz rate.

A character generator typically applies signals in parallel to a shift register. The parallel signals represent the dot pattern for one horizontal scan line for one character position on the face of the CRT. The signals are shifted into the horizontal sweep logic in synchronization with the electron beam and a dot is displayed for each signal.

There are a number of difficulties in maintaining installed CRT displays. The character generator, shift register and other related components are difficult to debug as a system by normal read/write means because of the fast timing circuitry; typically a 16.9 megahertz signal provides the timing. Also an incorrect horizontal sweep frequency may damage the horizontal oscillator in the horizontal video circuit.

OBJECTS OF THE INVENTION

Accordingly it is an object of the invention to provide a CRT display with improved test apparatus for verifying correct operation.

SUMMARY OF THE INVENTION

This invention provides a method and apparatus for testing and verifying the various logic elements of the cathode ray tube (CRT) display subsystem.

A data processing system embodying this invention includes a central processing unit for executing applications programs, an I/O microprocessor for servicing the peripheral subsystems, a main memory, an input/output memory and the CRT subsystem, all coupled in common to a system bus.

Vertical synchronization signals provide the basic timing for the CRT subsystem tests. All test measurements are made over two successive vertical synchronization cycles. A first occurrence of a vertical synchronization signal interrupts the I/O microprocessor to start a count and the third occurrence of a vertical synchronization signal interrupts the I/O microprocessor to stop the count and verify that the count falls within a predetermined range for correct operation.

The vertical synchronization timing is first checked by counting the number of refresh cycles occurring during two vertical synchronization cycles. The I/O microprocessor is interrupted by a vertical synchronization signal to generate a number of control signals which are applied to a multiplexer (MUX) to select a refresh signal REFRSH+00. The output of the MUX is applied to a counter which stores a count of the number of refresh signals received. A counter output signal goes to logical ONE after the counter receives 128 refresh signals and resets to logical ZERO after the counter receives 256 refresh signals.

The I/O microprocessor increments an address location in the I/O RAM each time the counter output signal resets from logical ONE to logical ZERO indicating that 256 refresh cycles were executed.

The I/O microprocessor is interrupted by the vertical synchronization signal at the end of the second vertical synchronization cycle and causes a branch to a firmware routine which stops the counting of refresh cycles, determines the number of refresh cycles in two vertical synchronization cycles, and verifies that the number of refresh cycles fell within a predetermined range which is acceptable. A count of between 925 and 1140 refresh cycles indicates correct vertical synchronization timing.

For the horizontal synchronization test, the I/O microprocessor is interrupted by the first occurrence of a vertical synchronization signal to generate control signals which are applied to the multiplexer to select the horizontal synchronization signals. The number of horizontal synchronization signals are counted over two vertical synchronization cycles. A count of between 596 and 666 indicates correct horizontal synchronization timing.

For verifying the video output logic, a number of data patterns are loaded into a character generator. A data buffer is loaded with character generator address information to display a predetermined character pattern on the CRT display tube.

The first vertical synchronization signal interrupts the I/O microprocessor to generate signals for the MUX to select a video data signal. The video data signal cycles for every dot displayed on the screen. The count over two vertical synchronization cycles is compared with a predetermined number.

BRIEF DESCRIPTION OF THE DRAWINGS

The novel features which are characteristic of the invention are set forth with particularity in the appended claims. The invention itself, however, both as to organization and operation may best be understood by reference to the following description in conjunction with the drawings in which:

DESCRIPTION OF THE PREFERRED EMBODIMENT

Figure 1:
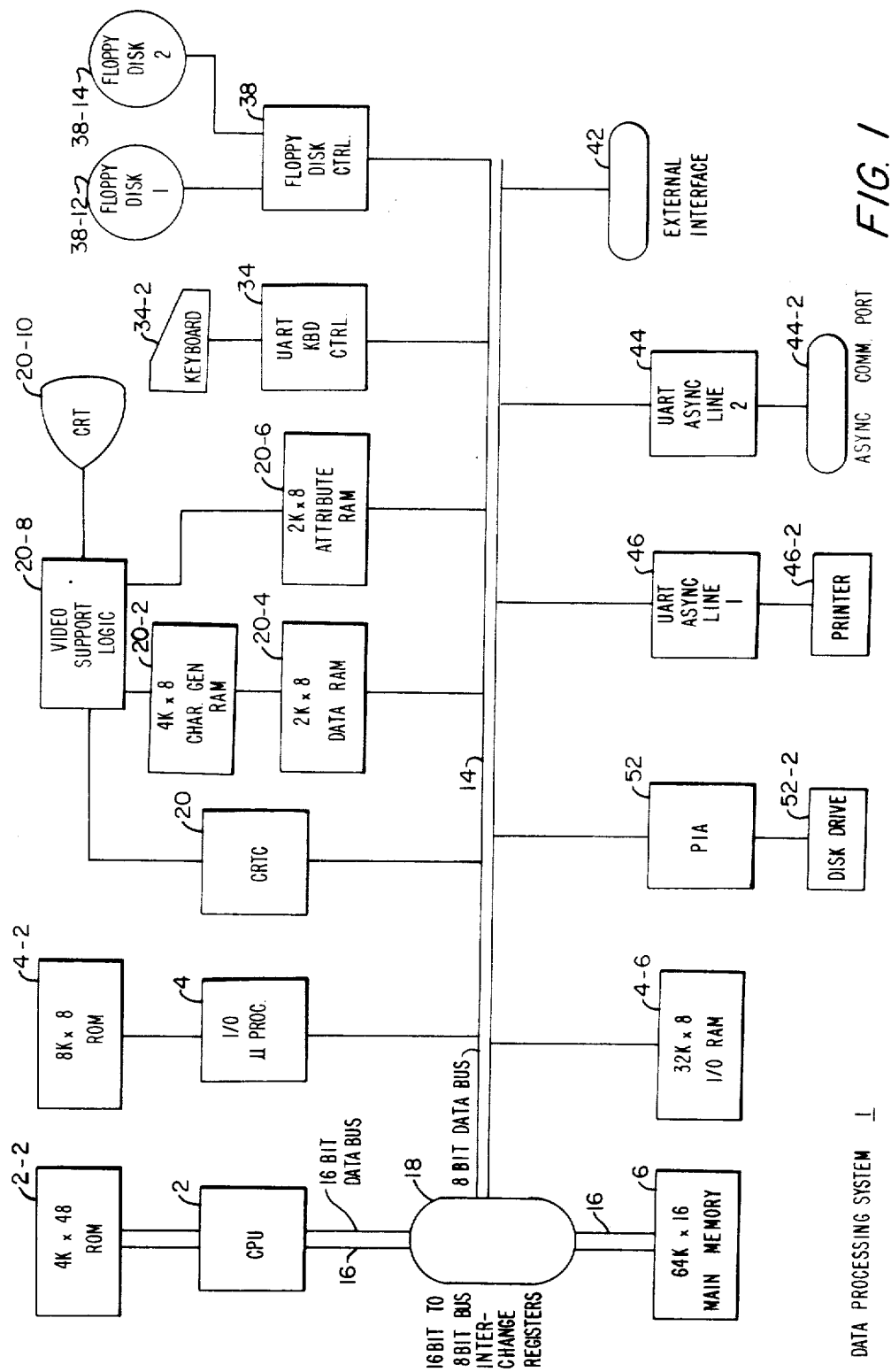
FIG. 1 shows an overall block diagram of the system.

FIG. 1 is an overall diagram of a data processing system 1 which includes a firmware controlled central processor unit (CPU) 2 as an applications processor and a microprocessor 4 as an input/output processor.

Systems applications are performed by the CPU 2 executing applications software programs stored in a 64K by 16 bit word dynamic main memory 6. The operating system microprograms used by the CPU 2 to execute the software instructions of the applications software programs are stored in a 4K by 48 bit word read only memory 8.

Associated with microprocessor 4 are an 8K by 8 bit word read only memory (ROM) 4-2 and a 32K by 8 bit word dynamic random access memory (RAM) 4-6. The ROM 4-2 stores the firmware routines necessary for the start up and the initialization of the data processing system 1. The RAM 4-6 stores tables, communications control programs and firmware for emulating a universal asynchronous receive transmit controller (UART) 44, and firmware for controlling a keyboard 34-2 by means of a UART 34, floppy disks 38-12, 38-14 by means of a floppy disc controller (FDC) 38, a printer 46-2 by means of a UART 46 and a cathode ray tube controller (CRTC) 20. The RAM 4-6 also includes a number of address locations, a "mailbox" which is used by the CPU 2 and microprocessor 4 to communicate with each other.

CPU 2 and main memory 6 transfer data between them over a 16 bit data bus 16 which is coupled to bus interchange registers 18. Also coupled to bus interchange registers 18 is an 8 bit data bus 14. Bus interchange registers 18 receives 16 bit data from the data bus 16 for transfer over data bus 14 as two 8 bit bytes; and also receives 8 bit bytes from data bus 14 for transfer over data bus 16. The microprocessor 4, RAM 4-6, CRTC 20, UART's 34, 44 and 46, and FDC 38 are all coupled in common to data bus 14.

Also coupled to data bus 14 are a peripheral interface adapter 52 for controlling a disk device 52-2, an asynchronous line UART 44 for receiving and transmitting data characters via an asynchronous port 48, a 2K by 8 bit word data random access memory (RAM) 20-4 for storing characters for display on a CRT 20-10 and a 2K by 8 bit word attribute random access memory (RAM) 20-6 for storing attribute characters. Attribute characters are used typically for such CRT 20-10 display functions as underlining characters or character fields or causing certain selected characters or character fields to blink or be displayed with higher intensity. Character codes stored in RAM 20-4 are applied to a 4K by 8 bit word character generator random access memory (RAM) 20-2 which generates the codes representative of the raster lines of data which display the characters on the face of the CRT 20-10. A video support logic 20-8 is coupled to the CRTC 20, character generator ROM 20-2 and attribute RAM 20-6 for generating the lines of characters on the face of the CRT 20-10.

The FDC 38 is typically an NEC μPD765 single-/double density floppy disc controller described in the NEC 1982 Catalog published by NEC Electronics USA Inc., Microcomputer Division, One Natick Executive Park, Natick, Massachusetts 01760.

The microprocessor 4 is typically a Motorola MC68B09 8 bit microprocessing unit. The PIA 52 is typically a Motorola MC68B21 peripheral interface adapter. The CRTC 20 is typically a Motorola MC68B45 CRT controller.

The microprocessor 4, PIA 52 and CRTC 20 are described in the Motorola Microprocessor Data Manual, copyright 1981 by Motorola Semiconductor Products Inc., 3501 Bluestein Blvd., Austin, Texas 78721.

The UART's 34, 44 and 46 are typically Signetics 2661 Universal Asynchronous Receive Transmit Controllers described in the Signetics MOS Microprocessor Data Manual, copyright 1982 by Signetics Corporation, 811 East Arques Avenue, Sunnyvale, California 94086.

Figure 2:
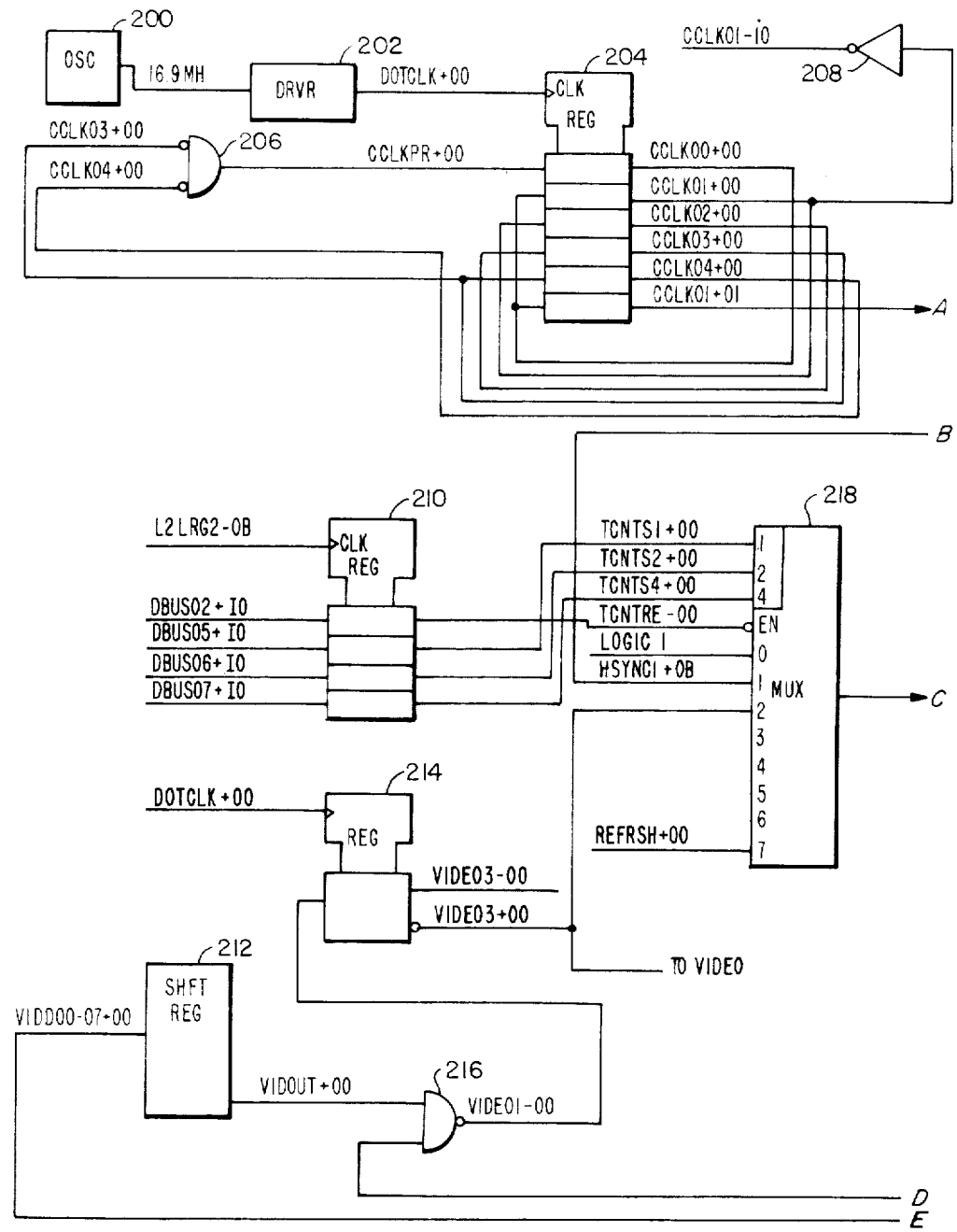
FIG. 2 shows the detailed test and verification logic of the CRT display system.
Figure 2:
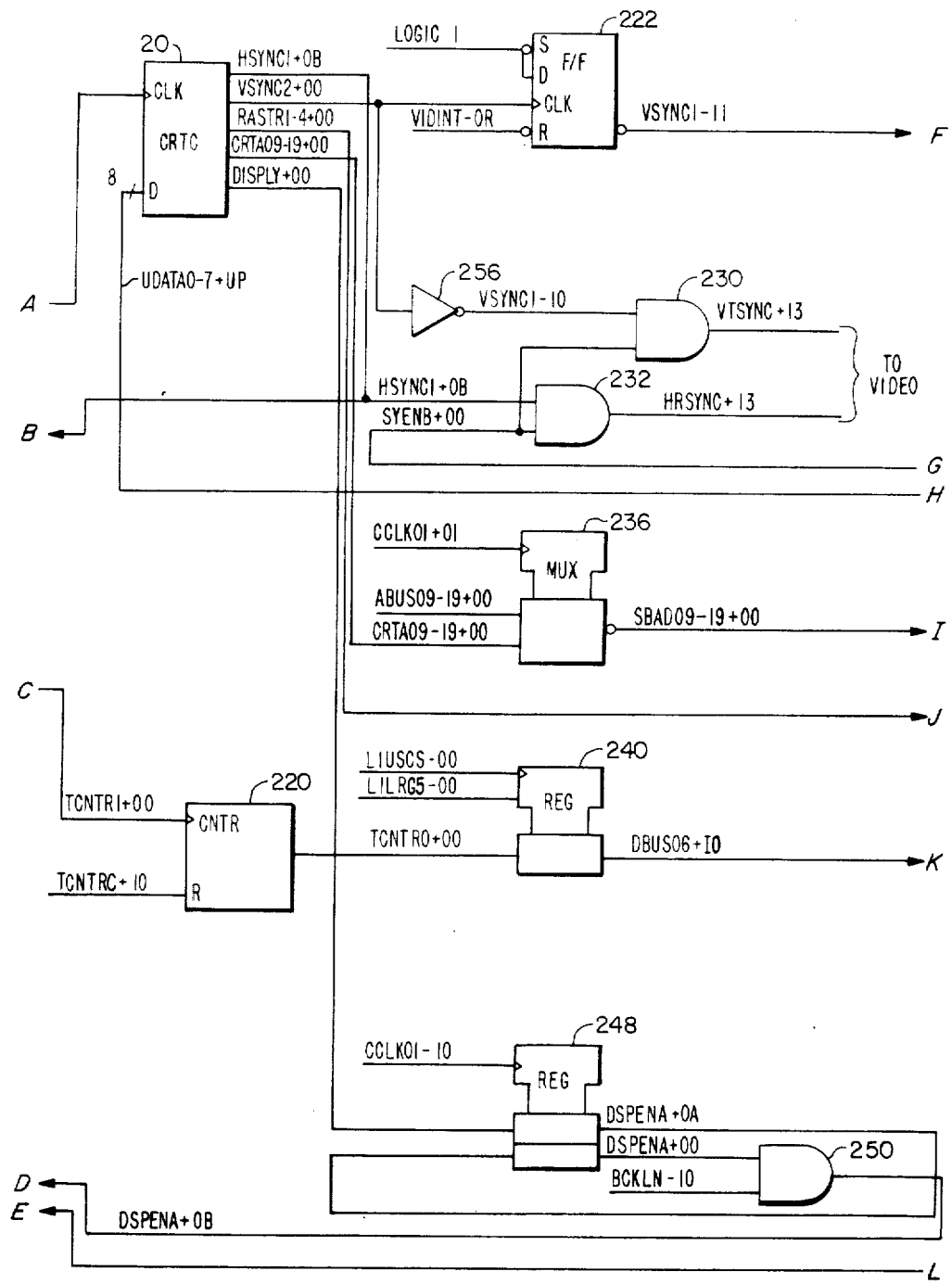
Figure 2:
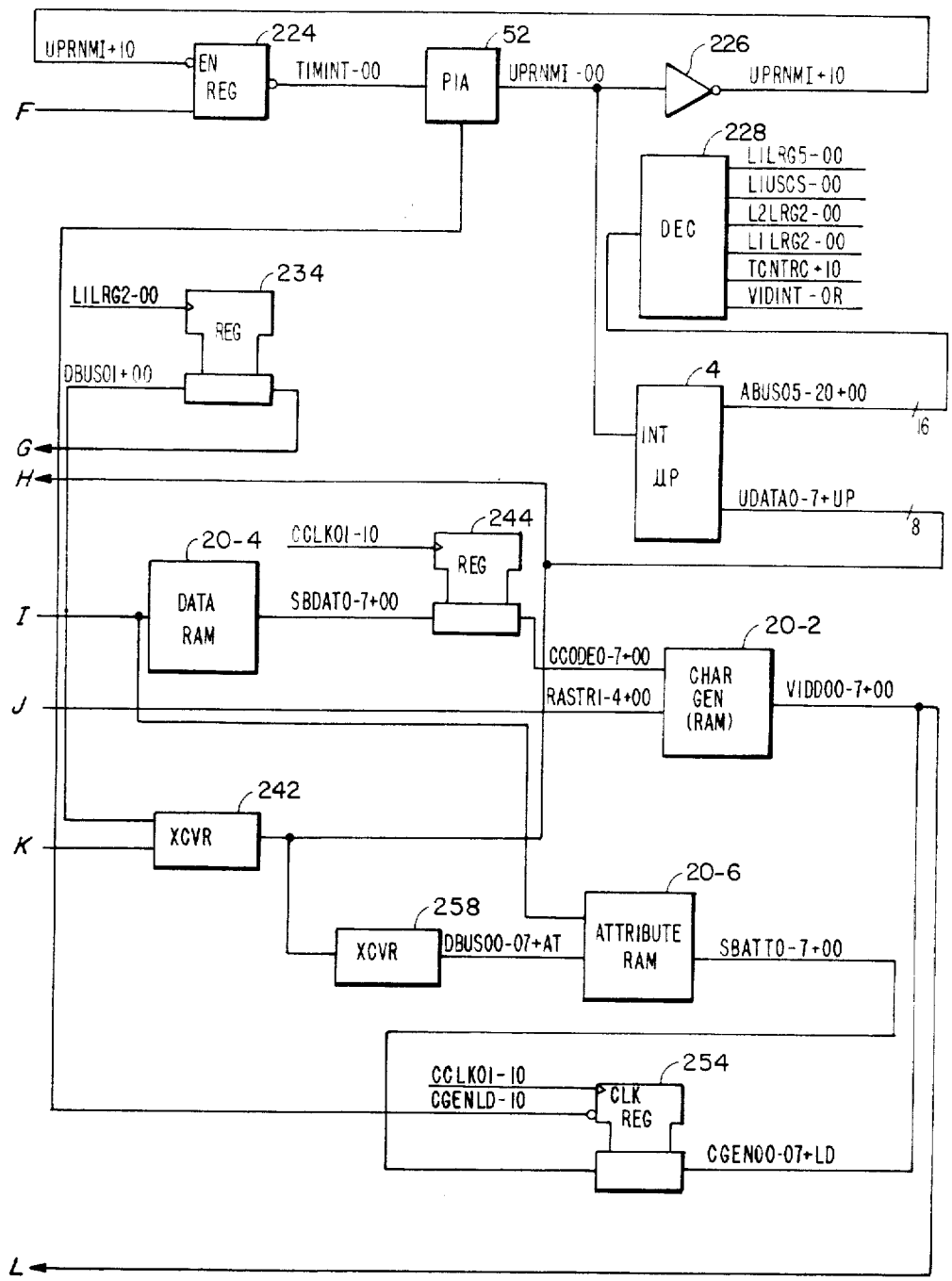

Referring to FIG. 2, a free running oscillator 200 generates a 16.9 megahertz square wave signal 16.9 MH which is applied to a driver 202 to generate a clock signal DOTCLK+00. Clock signal DOTCLK+00 is applied to a register 204 which generates clock signals CCLK01+00 and CCLK01+01 with a frequency of 1.88 MHz or 531 nanoseconds per cycle.

Clock signal CCLK01+01 is applied to CRTC 20 which generates one horizontal synchronization signal HSYNC1+0B for every 99 cycles of clock signal CCLK01+01. CRTC 20 generates one vertical synchronization signal VSYNC2+00 for every 317 horizontal sync signals HSYNC1+0B.

The output clock signals from register 204 are at logical ONE for four cycles of clock signal DOTCLK+00 and at logical ZERO for five cycles of clock signal DOTCLK+00.

Signal CCLKPR+00 is at logical ONE forcing signal CCLK00+00 to logical ONE until clock signal CCLK03+00 or CCLK04+00 is at logical ONE. Then on the next rise of signal DOTCLK+00, signal CCLK00+00 is forced to logical ZERO. Note that clock signal CCLK00+00 rises on the first rise of signal DOTCLK+00, clock signal CCLK01+00 rises on the second rise of signal DOTCLK+00, clock signal CCLK02+00 rises on the third rise of signal DOTCLK+00, and clock signal CCLK03+00 rises on the fourth rise of signal DOTCLK+00, causing signal CCLK00+00 to fall on the fifth rise of signal DOTCLK+00. Signal CCLK00+00 will rise on the tenth rise of signal DOTCLK+00 when signal CCLK04+00 is at logical ZERO.

CRTC 20 generates a sequence of successive addresses via signals CRTA09-19+00 which are applied to the data RAM 20-4 via a multiplexer (MUX) 236 and signals SPAD09-19-00. MUX 236 selects the signals applied to input terminals 1 when clock signal CCLK01+1 is at logical ONE. The output data signals SBDAT07+00 are stored in a register 244 on the next half cycle when clock signal CCLK01−10 rises (CCLK01+01 falls).

The output signals CCODE0−7+00 select the address location in character generator RAM 20-2 of the character specified by signals CCODE0−7 and output on signals VIDD00−07+00 the bits specified by the raster signals RASTR1−4+00 from CRTC 20. Signals VIDD00−07+00 are applied to a shift register 252 which generates a bit stream, signal VIDOUT+00, to be displayed on the specified character position and raster line (horizontal) on the view screen.

The CRTC 20 generates a display enable signal DISPLY+00 which is applied to a NAND gate 216 via a register 248 on the rise of clock signal CCLK01−10, signal DSPENA+0A, signal DSPENA+00 on the next rise of clock signal CCLK01−10, signal DSPENA+00, and AND gate 250 and signal DSPENA+0B. Blanking signal BLKLN−10 applied to AND gate 250 blanks the vide screen for a predetermined character position.

Signal VIDE01−00 is stored in a register 214 on the next rise and subsequent rises of signal DOTCLK+00. Output signal VIDEO3+00 is applied to the video screen for display.

Horizontal sync signal HSYNC1+0B is applied to the video via an AND gate 232 and signal HRSYNC+13. The vertical sync signal VSYNC2+00 is applied to the video via an inverter 256, signal VSYNC1−10, an AND gate 230 and signal VTSYNC+13. Signal SYENB+00 is applied to AND gates 2330 and 232 to prevent damage to the video tube during the test operation by suppressing the horizontal and vertical sync signals HRSYNC+13 and VTSYNC+13. Signal SYENB+00 is generated as the output of a register 234. I/O microprocessor 4 generates data bus signal UDATA1+UP and clock signal L1LRG2−00. Signal UDATA1+UP is applied to a transceiver (XCVR) 242 which generates data signal DBUS01+IO for storage in register 234. Transceivers isolate the various sections of data bus 14.

The display bit signal VIDEO3+00 is applied to input terminal 2 of a MUX 218 and horizontal sync signal HSYNC1+0B is applied to input terminal 1 of MUX 218. MUX 218 is enabled by signal TCNTRE−00. Input terminals of MUX 218 are selected by signal TCNTS1+00, TCNTS2+00 and TCNTS4+00 applied to select terminals 1, 2 and 4, respectively.

Signals TCNTRE+00, TCNTS1+00, TCNTS2+00 and TCNTS4+00 are generated by I/O microprocessor 4 via data signals DBUS02+IO, DBUS05+IO, DBUS06+IO and DBUS07+IO, respectively, from XCVR 242 and signals UDATA2,5−7+UP, which are stored in a register 210 on the rise of a clock signal L2LRG2−00.

The output signal TCNTR1+00 from MUX 218 is applied to a counter 220. Output signal TCNTR0+00 is forced to logical ONE when the signal TCNTR1+00 has gone negative 128 times.

Signal TCNTR0+00 is stored in a register 240 on the rise of signal L1USCS−00 and applied to I/O microprocessor 4 by signal L1LRG5−00 via signal DBUS06+IO, XCVR 242 and signal UDATA6+UP.

The vertical sync signal VSYNC2+00 interrupts the I/O microprocessor 4 via a flop 222, signal VSYNC1−11, a register 224, interrupt signal TIMINT−00, PIA 52 and signal UPRNMI−00. Register 224 is enabled by signal UPRNMI+10 from an inverter 226.

The character generator RAM 20-2 is loaded with test patterns by the I/O microprocessor 4. The I/O microprocessor 4 address signals ABUS09−19+00 are applied to input terminals 0 of MUX 236. Output signals SBAD09−19−00 select address locations in attribute RAM 20-6. Data signals UDATA0−7+UP from I/O microprocessor 4 are applied to RAM 20-6 via a XCVR 258 and signals DBUS00−07+AT. Output signals SBATT0−7+00 are stored in a register 254 on the rise of clock signal CCLK01−10. Register 254 is enabled during the character generator RAM 20-2 load operation by signal CGENLD−10. Signals CGEN00−07+LD are stored in character generator RAM 20-2 at address locations specified by signals CCODE0−7+00 and RASTR1−4+00.

The use of the character generator RAM 20-2 as a test vehicle is described in U.S. application Ser. No. 445,608, filed 11-30-82 entitled "Diskette Subsystem Fault Isolation via Video Subsystem Loopback" which is herein incorporated by reference.

The following are Boolean expressions for the signals generated by the I/O microprocessor 4 during the test and verification operation via the decoder 228.

$$L1LRG5-00 = \overline{\overline{(ABUS18+00)}\,\overline{(ABUS17+00)}\,\overline{(IOENBL-1A)}}$$

$$\overline{(ABUS16+00)\,(ABUS15+00)\,\overline{(ABUS14+00)}}$$

$$L1USCS-00 = \overline{(ABUS17+00)\,\overline{(UOFFBS+00)}\,\overline{(IOENBL-1A)}}$$

$$\overline{(ABUS16+00)\,(ABUS15+00)\,\overline{(ABUS14+00)}}$$

$$(IOSTRB-00)$$

$$L1LRG2-00 = \overline{\overline{(ABUS18+00)}\,\overline{(IOENBL-1A)}\,(ABUS17+00)}$$

$$\overline{(ABUS16+00)\,(ABUS15+00)\,\overline{(ABUS14+00)}}$$

$$\overline{(TIME23-00)}$$

-continued $$L2LRG2-00 = \frac{}{(ABUS18+00)\,(\overline{IOENBL-1A})\,(ABUS17+00)}$$

$$(ABUS16+00)\,(ABUS15+00)\,\overline{(ABUS14+00)}$$

$$(TIME23-00)$$

$$TCNTRC+10 = \frac{}{(UBUSRD-00)\,(\overline{UOFFBS+00})\,(\overline{STRBEN-02})}$$

$$(\overline{DBUS07+IO})\,(DBUS06+IO)\,(DBUS05+IO)$$

$$STRBEN-02 = \frac{}{(ABUS18+00)\,\overline{(IOENBL-1A)}\,\overline{(ABUS17+00)}}$$

$$(ABUS16+00)\,\overline{(ABUS15+00)}\,\overline{(ABUS14+00)}$$

$$IOENBL-00 = \frac{}{(ABUS05+00)\,(ABUS06+00 \longrightarrow ABUS12+00)}$$

$$\overline{(REFRSH+00)}((L6BSCY+00)+\overline{(U2MEM-00)})$$

$$\overline{(SYSCLR-00)}$$

$$VIDINT-OR = \frac{}{(UBUSRD-00)\,(\overline{UOFFBS+00})\,(\overline{STRBEN-02})}$$

$$(DBUS07+IO)\,(\overline{DBUS06+IO})\,(DBUS05+IO)$$

Signal IOENBL−1A indicates that this is not an input/output data transfer operation.

Signal L6BSCY+00 indicates a CPU 2 bus cycle.

Signal U2MEM−00 indicates that this is not an I/O microprocessor 4 to main memory 6 transfer.

Clock signal TIME23−00 times the output signals L1LRG2−00 and L2LRG2−00 to the OSC 200.

Clock signal IOSTRB−00 which is generated from signal TIME23−00 times signal L1USCS−00 to the OSC 200.

Signal UBUSRD−00 indicates an I/O microprocessor 4 read operation.

Signal UOFFBS−00 indicates that the CPU 2 controls the operation.

Signal STRBEN−02 enables the address signals from the I/O microprocessor 4 to enable the data bus signals from the I/O microprocessor 4.

Figure 3:
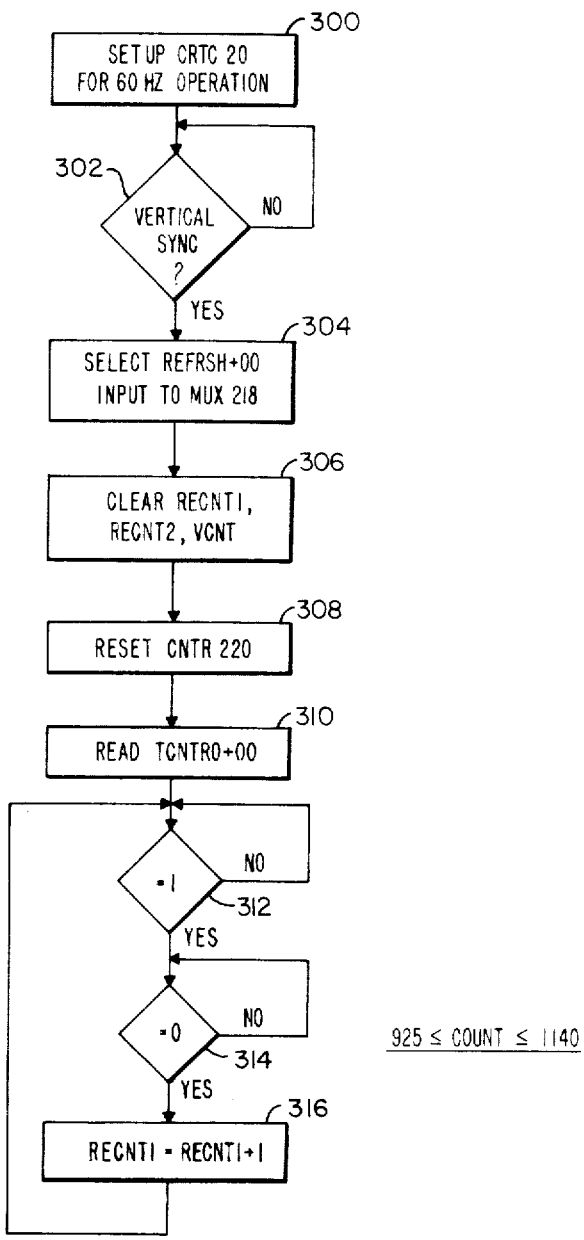
FIG. 3 is a flow diagram showing the test and verification operation of the vertical synchronization timing.

Referring to FIG. 3, the vertical synchronization test assumes that the refresh test, described in copending related Application Ser. No. 510,711 entitled "Apparatus and Method for Testing and Verifying the Refresh Logic of Dynamic MOS Memories" which is incorporated herein by reference, was successfully completed.

Each refresh cycle takes 32 microseconds. A refresh signal REFRSH+00 is applied to input terminal 7 of MUX 218. This causes signal TCNTR1+00 to fall every 32 microseconds thereby incrementing counter 220.

Each vertical synchronization signal VSYNC2+00 interrupts I/O microprocessor 4 via flop 222, signal VSYNC−11, register 224, signal TIMINT−00, PIA 52 and interrupt signal UPRNMI−00.

The I/O microprocessor 4 when interrupted by the vertical synchronization signal a third time reads a count of the number of refresh operations between the first and third vertical synchronization signals. For correct synchronization timing, the count should be between 925 and 1190.

The time between successive vertical sync pulses is 16.66 milliseconds or 33.32 milliseconds for two successive synchronization pulses. Each refresh cycle takes 32 microseconds. Therefore, the nominal count is $33.23 \times 10^{-3}$ divided by $32 \times 10^{-6}$ or 1039. The range allows for differences in time of the various I/O microprocessor 4 interrupt cycles.

A number of tests are preformed by a combination of hardware and firmware. The first test as shown in FIG. 3 checks the time between successive occurrences of the vertical synchronization signal VSYNC2+00 by counting the number of main memory 4 refresh cycles that occur during two vertical synchronization cycles. One vertical synchronization cycle is the time between successive occurrences of vertical synchronization signal VSYNC2+00.

Figure 4:
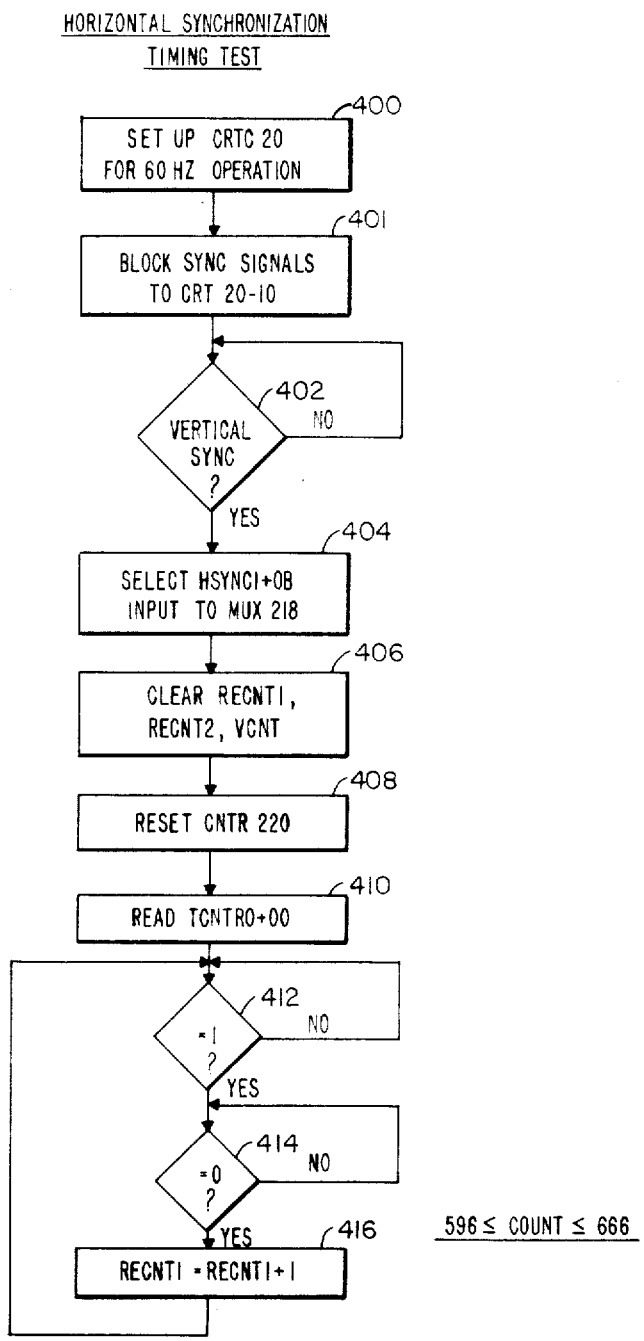
FIG. 4 is a flow diagram showing the test and verification operation of the horizontal synchronization logic.

The second test as shown in FIG. 4 verifies the horizontal synchronization timing by counting the occurrences of horizontal synchronization signal HSYNC1+0B during the two vertical synchronization cycles.

Figure 5:
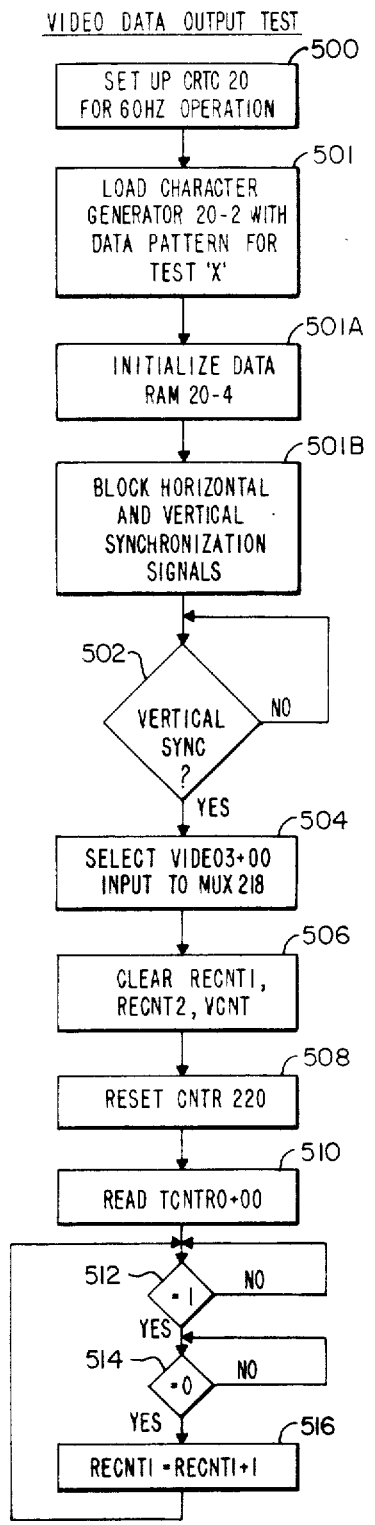
FIG. 5 is a flow diagram showing the test and verification operation of the general case of a data bit pattern.

The third test as shown in FIG. 5 verifies the number of bits being displayed on the face of the CRT 20-10 by counting the occurrences of signal VIDEO3+00 during the two vertical synchronization cycles.

Referring to FIGS. 3, 4 and 5, in blocks 300, 400 and 500 the I/O microprocessor 4 sets up the CRTC 20 for 60 hertz operation. That is, the basic source of power for the overall system is at 60 hertz. This 60 hertz input timing conditions the CRTC 20 to develop the horizontal synchronization timing to generate the raster lines to sweep the face of the CRT 20-10 every 16.66 microseconds.

The system loops in block 302 waiting for the vertical synchronization signal VSYNC2+00 to interrupt the I/O microprocessor 4. When interrupted the I/O microprocessor 4 as shown in block 304 generates signals TCNTRE−00, TCNTS1+00, TCNTS2+00 and TCNTS4+00 to enable MUX 218 and to select input terminal 7 thereby coupling the refresh signal REFRSH+00 to counter 220.

In block 306 I/O microprocessor 4 clears a number of address locations in I/O RAM 4-6 to binary ZERO. These locations are identified by the firmware as RECNT 1, RECNT 2 and VCNT. RECNT 1 stores a count of ONE for each 256 signals received by counter 220. RECNT 2 stores a count of the number of cycles required to change the state of signal TCNTR0+00 after the second vertical synchronization cycle and VCNT counts the number of vertical synchronization signals VSYNC2+00 received.

In block 308 the I/O microprocessor 4 resets counter 220 by generating signal TCNTRC+10, and in block 310 the I/O microprocessor 4 tests the counter 220 output signal TCNTR0+00.

If in decision block 312 the I/O microprocessor 4 finds a binary ZERO, the firmware keeps counting refresh cycles. When a test of decision block 312 indicates that signal TCNTR0+00 is at logical ONE, then the firmware branches to decision block 314 where it waits until signal TCNTR0+00 is at logical ZERO. The firmware loops on decision block 312 for 128 refresh cycles and loops in decision block 314 for another 128 refresh cycles.

In block 316 the contents of RECNT 1 is incremented by binary ONE indicating 256 refresh cycles.

The horizontal synchronization test of FIG. 4 operates in a similar manner with some exception. In block 401 signal SYENB+00 at logical ZERO prevents the generation of signals VTSYNC+13 and HRSYNC+13 from AND gates 230 and 232, respectively, thereby protecting the horizontal synchronization circuitry in video support logic 20-8.

In block 404 signals TCNTRE−00, TCNTS1+00, TCNTS2+00 and TCNTS4+00 select input terminal 1 of MUX 218 thereby coupling horizontal synchronization signal HSYNC1+0B to counter 220.

Blocks 402 through 416 perform the same functions as their counterparts, blocks 302 through 316, respectively.

The video data output test of FIG. 5 loads, in block 501, the character generator RAM 20-2 with various bit patterns in a predetermined number of addresses. Combinations of these bit patterns are selected for the various tests "x", "x+1", "x+2", etc.

I/O microprocessor 4 in block 501A loads data RAM 20-4 with addresses which are applied to character generator RAM 20-2 to generate specific bit streams over signal VIDE03+00.

In block 501B the I/O microprocessor 4 generates signal SYENB+00 at logical ZERO to block the vertical and horizontal synchronization signals VTSYNC+13 and HRSYNC+13.

In block 504 signals TCNTRE−00, TCNTS1+00, TCNTS2+00 and TCNTS4+00 select input terminal 2 of MUX 218 to couple signal VIDEO3+00 to counter 220.

Blocks 502 through 516 perform the sme functions as their counterparts in FIGS. 3 and 4.

Figure 6:
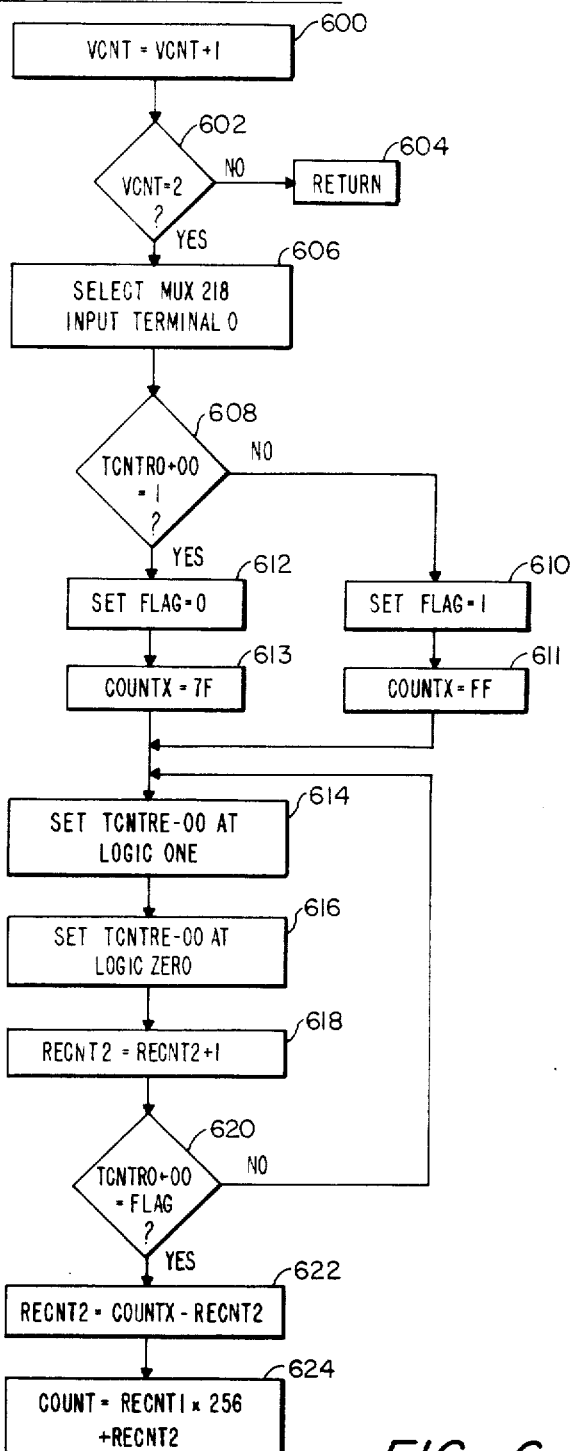
FIG. 6 is a flow diagram of the vertical synchronization interrupt operation.

FIG. 6 shows the block diagram of the firmware routine which is generated by the I/O microprocessor 4 when interrupted by the vertical synchornization signal VSYNC2+00 via flop 222, register 224 and PIA 52.

Block 600 increments the contents of VCNT by binary ONE.

Decision block 602 tests if this is the first or second vertical synchronization signal VSYNC2+00. If it is the first, the I/O microprocessor 4 returns to continue the firmware routine of FIGS. 3, 4 and 5. If it is the second vertical synchronization signal VSYNC2+00, indicating that the final count is stored in RECNT 1 and counter 220, then the I/O microprocessor 4 continues the firmware routine as follows.

In block 606 signals TCNTRE−00, TCNTS1+00, TCNTS2+00 and TCNTS4+00 select logical ONE at input terminal 0 of MUX 218 to apply to counter 220.

Decision block 608 tests signal TCNTR0+00 and sets a flag bit at logical ONE in block 610 if signal TCNTR0+00 is at logical ZERO, or the flag bit at logical ZERO in block 612 if signal TCNTR0+00 is at logical ONE. The flag bit is a bit in address location FLAG of I/O RAM 4-6. If in block 612 FLAG was set to logical ZERO, then in block 613 an address location COUNTX of I/O RAM 4-6 is set to hexadecimal 7F. If in block 610 FLAG was set to logical ONE, then in block 611 COUNTX is set to hexadecimal FF.

In blocks 614 and 616 signal TCNTRE−00 is cycled to enable MUX 218 thereby coupling the logical ONE signal at input terminal 0 of MUX 218 to counter 220. In block 618 the contents of RECNT 2 is incremented by binary ONE.

Decision block 620 tests if signal TCNTR0+00 is at the same logic level as the contents of FLAG. If it is not, the firmware repeats blocks 614 through 620. When signal TCNTR0+00 is at the same logic level as the contents of FLAG, then the firmware branches to block 222. Branching to block 622 indicates that counter 220 has counted to decimal 128 or decimal 256.

In block 622 the number stored in counter 220 when the second vertical synchronization signal VSYNC2+00 was sensed is generated by subtracting the contents of RECNT 2 from the contents of COUNTX and storing the value in RECNT 2. Signal TCNTR0+00 is at logical ZERO when counter 220 stores a count of from 0 to 127 (hexadecimal 00 to 7F) and is at logical ONE when counter 220 stores a count of from 128 to 255 (hexadecimal 80 to FF). If signal TCNTR0+00 is at logical ZERO, the contents of RECNT 2 must be subtracted from hexadecimal FF to obtain the count stored in counter 220 after two vertical synchronization cycles. If signal TCNTR0+00 is at logical ONE, then the contents of RECNT 2 must be subtracted from hexadecimal 7F to obtain the count stored in counter 220 after two vertical synchronization cycles.

Block 624 generates the contents of COUNT, an address location in I/O RAM 4-6, by multiplying the contents of RECNT 1 by 256 and adding the contents of RECNT 2.

For proper operation of the horizontal synchronization timing test, the contents of COUNT should be greater than or equal to 596 and less than or equal to 666.

Having shown and described a preferred embodiment of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. A method of verifying the correct synchronization of a cathode ray tube (CRT) display subsystem of a data processing system, said data processing system including an I/O microprocessor, a dynamic random access memory (RAM) which is periodically refreshed and said CRT display subsystem, said method comprising the steps of:
  (a) generating vertical synchronization signals in said CRT display subsystem;
  (b) interrupting said I/O microprocessor by a first occurrence of said vertical synchronization signals;
  (c) by said I/O microprocessor generating a plurality of control signals in a first state for selecting as an input to a counter a refresh signal which refreshes addressed locations of said RAM;
  (d) by said counter, counting the number of said refresh signals;
  (e) interrupting said I/O microprocessor by a subsequent occurrence of a vertical synchronization signal;
  (f) reading out the count of said refresh signals when said I/O microprocessor has been interrupted by a predetermined number of occurrences of said vertical synchronization signals; and
  (g) verifying that the count of said refresh signals is within a first predetermined range thereby indicating that said vertical synchronization cycle timing is correct.

2. The method of claim 1 further comprising the steps of:
  (a) generating horizontal synchronization signals;
  (b) interrupting said I/O microprocessor by a first occurrence of said vertical synchronization signals;
  (c) by said I/O microprocessor generating said plurality of control signals in a second state for selecting as an input to said counter said horizontal synchronization signals;
  (d) by said counter counting the number of said horizontal synchronization signals;
  (e) interrupting said I/O microprocessor by a subsequent occurrence of said vertical synchronization signal;
  (f) reading out the count of said horizontal synchronization signals when said I/O microprocessor has been interrupted by a predetermined number of occurrences of said vertical synchronization signals; and
  (g) verifying that the count of said horizontal synchronization signals is within a second predetermined range thereby indicating that said horizontal synchronization cycle timing is correct.

3. The method of claim 2 further comprising the steps of:
  (a) generating said data bit signals, successive occurrences of said data bit signals being indicative of a predetermined display on the screen of said CRT;
  (b) interrupting said I/O microprocessor by a first occurrence of said vertical synchronization signals;
  (c) by said I/O microprocessor generating said plurality of control signals in a third state for selecting as an input to said counter said data bit signal;
  (d) by said counter counting the number of occurrences of said data bit signals;
  (e) interrupting said I/O microprocessor by a subsequent occurrence of said vertical synchronization signals;
  (f) reading out the count of said data bit signals when said I/O microprocessor has been interrupted by a predetermined number of occurrences of said vertical synchronization signals; and
  (g) verifying that the count of said number of occurrences of said data bit signals is within a third predetermined range thereby indicating that said data bit timing is correct.

4. A data processing system includes a dynamic random access memory (RAM), an input/output microprocessor and cathode ray tube display terminal (CRT), all coupled in common to a system bus, said data processing system including apparatus for testing and verifying the timing of the CRT, said apparatus comprising:
  first means for generating vertical synchronization signals;
  second means for generating refresh signals for refreshing said RAM;
  means including the I/O microprocessor responsive to a first occurrence of said vertical synchronization signals for generating a plurality of control signals in a first state; and
  counter means responsive to said plurality of control signals in said first state for selecting as an input said refresh signals and having means for storing a first count of the number of occurrences of said refresh signals received by said counter means;
  said I/O microprocessor having means for storing a second count of the number of subsequent occurrences of said vertical synchronization signals and having means for verifying that said first count is within a first predetermined range when said second count is equal to a predetermined count thereby verifying the timing of said vertical synchronization cycle.

5. The apparatus of claim 4 wherein:
  said I/O microprocessor includes means responsive to a first occurrence of said vertical synchronization signals for generating said plurality of control signals in a second state;
  said counter means includes means responsive to said plurality of control signals in said second state for selecting as an input said horizontal synchronization signals and includes means for storing a third count of the number of occurrences of said horizontal synchronization signals received by said counter means;
  said I/O microprocessor includes means for verifying that said third count is within a second predetermined range when said second count is equal to a predetermined count thereby verifying the timing of said horizontal synchronization cycle.

6. The apparatus of claim 5 further comprising means for generating data bit signals and wherein:
  said I/O microprocessor includes means responsive to a first occurrence of said vertical synchronization signals for generating said plurality of control signals in a third state;
  said counter means includes means responsive to said plurality of control signals in said third state for selecting as an input said data bit signals and includes means for storing a fourth count of the number of occurrences of said data bit signal received by said counter means;
  said I/O microprocessor includes means for verifying that said second count is equal to a predetermined count thereby verifying said data bit timing.

7. The apparatus of claim 6 wherein said second count is two.

* * * * *